US009627227B2

United States Patent
Malatkar et al.

(10) Patent No.: US 9,627,227 B2
(45) Date of Patent: *Apr. 18, 2017

(54) BUMPLESS BUILD-UP LAYER PACKAGE WARPAGE REDUCTION

(71) Applicant: Intel Corporation, Santa Clara, CA (US)

(72) Inventors: Pramod Malatkar, Chandler, AZ (US); Drew W. Delaney, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/465,325

(22) Filed: Aug. 21, 2014

(65) Prior Publication Data

US 2014/0363929 A1 Dec. 11, 2014

Related U.S. Application Data

(62) Division of application No. 13/173,327, filed on Jun. 30, 2011, now Pat. No. 8,848,380.

(51) Int. Cl.
*H01L 21/56* (2006.01)
*H01L 25/16* (2006.01)
(Continued)

(52) U.S. Cl.
CPC ........ *H01L 21/561* (2013.01); *H01L 21/6835* (2013.01); *H01L 23/562* (2013.01);
(Continued)

(58) Field of Classification Search
CPC ....... H01L 2224/97; H01L 2924/01029; H01L 21/568; H01L 23/5389; H01L 21/56;
(Continued)

(56) References Cited

U.S. PATENT DOCUMENTS 4,921,160 A   5/1990  Flynn et al.
5,353,498 A   10/1994 Fillion et al.
(Continued)

FOREIGN PATENT DOCUMENTS

CN   101404267 A   4/2009
JP   2004-056093 A   2/2004
(Continued)

OTHER PUBLICATIONS

Office Action received for Taiwan Patent Application No. 101119764, mailed on Dec. 20, 2012, 2 pages of Office Action only.
(Continued)

*Primary Examiner* — Mohsen Ahmadi
(74) *Attorney, Agent, or Firm* — Winkle, PLLC

(57) ABSTRACT

The present disclosure relates to the field of fabricating microelectronic packages and the fabrication thereof, wherein a microelectronic device may be formed within a bumpless build-up layer coreless (BBUL-C) microelectronic package and wherein a warpage control structure may be disposed on a back surface of the microelectronic device. The warpage control structure may be a layered structure comprising at least one layer of high coefficient of thermal expansion material, including but not limited to a filled epoxy material, and at least one high elastic modulus material layer, such as a metal layer.

15 Claims, 15 Drawing Sheets

(51) Int. Cl.
  *H01L 25/00* (2006.01)
  *H01L 25/10* (2006.01)
  *H01L 23/00* (2006.01)
  *H01L 21/683* (2006.01)

(52) U.S. Cl.
  CPC ............. *H01L 24/19* (2013.01); *H01L 24/20* (2013.01); *H01L 25/105* (2013.01); *H01L 25/16* (2013.01); *H01L 25/50* (2013.01); *H01L 24/32* (2013.01); *H01L 24/73* (2013.01); *H01L 2221/68372* (2013.01); *H01L 2224/214* (2013.01); *H01L 2224/32225* (2013.01); *H01L 2224/32245* (2013.01); *H01L 2224/73267* (2013.01); *H01L 2224/92244* (2013.01); *H01L 2225/107* (2013.01); *H01L 2225/1035* (2013.01); *H01L 2924/01029* (2013.01); *H01L 2924/12042* (2013.01); *H01L 2924/1815* (2013.01); *H01L 2924/3511* (2013.01)

(58) Field of Classification Search
  CPC ........... H01L 23/3107; H01L 21/67288; H01L 24/20; H01L 2224/214; H01L 2224/32245; H01L 2224/92244; H01L 2225/1035; H01L 2225/3511
  USPC .................. 438/55, 106, 112, 119, 122, 124, 438/126–127; 257/E21.499, E21.502
  See application file for complete search history.

(56) References Cited

U.S. PATENT DOCUMENTS

| | | | |
|---|---|---|---|
| 5,497,033 A | 3/1996 | Fillion et al. | |
| 5,510,649 A | 4/1996 | Adhihetty et al. | |
| 5,527,741 A | 6/1996 | Cole et al. | |
| 5,841,193 A | 11/1998 | Eichelberger | |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,472,762 B1 | 10/2002 | Kutlu | |
| 6,489,185 B1 | 12/2002 | Towle et al. | |
| 6,507,122 B2 | 1/2003 | Blackshear | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,109,055 B2 | 9/2006 | McDonald et al. | |
| 7,112,467 B2 | 9/2006 | Eichelberger et al. | |
| 7,144,756 B1 | 12/2006 | Wang et al. | |
| 7,160,755 B2 | 1/2007 | Lo et al. | |
| 7,183,658 B2 | 2/2007 | Towle et al. | |
| 7,189,596 B1 | 3/2007 | Mu et al. | |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,459,782 B1 | 12/2008 | Li | |
| 7,476,563 B2 | 1/2009 | Mangrum et al. | |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,633,143 B1 | 12/2009 | Fan | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 7,723,164 B2 | 5/2010 | Lu et al. | |
| 7,851,905 B2 | 12/2010 | Chrysler et al. | |
| 8,035,216 B2 | 10/2011 | Skeete | |
| 8,093,704 B2 | 1/2012 | Palmer et al. | |
| 8,105,934 B2 | 1/2012 | Kwon et al. | |
| 8,264,849 B2 | 9/2012 | Guzek | |
| 8,304,913 B2 | 11/2012 | Nalla et al. | |
| 8,319,318 B2 | 11/2012 | Nalla et al. | |
| 8,497,587 B2 | 7/2013 | Ma | |
| 8,535,989 B2 | 9/2013 | Sankman et al. | |
| 2001/0015492 A1 | 8/2001 | Akram et al. | |
| 2002/0088116 A1 | 7/2002 | Milkovich et al. | |
| 2002/0145204 A1 | 10/2002 | Naka et al. | |
| 2003/0207495 A1 | 11/2003 | Akram | |
| 2004/0262776 A1 | 12/2004 | Lebonheur et al. | |
| 2005/0062173 A1 | 3/2005 | Vu et al. | |
| 2006/0145328 A1 | 7/2006 | Hsu | |
| 2006/0151865 A1 | 7/2006 | Han et al. | |
| 2006/0186536 A1 | 8/2006 | Hsu | |
| 2007/0279885 A1 | 12/2007 | Basavanhally et al. | |
| 2008/0029895 A1 | 2/2008 | Hu et al. | |
| 2008/0128916 A1 | 6/2008 | Soejima et al. | |
| 2008/0308917 A1 | 12/2008 | Pressel et al. | |
| 2008/0315377 A1 | 12/2008 | Eichelberger et al. | |
| 2008/0315391 A1 | 12/2008 | Kohl et al. | |
| 2008/0315398 A1 | 12/2008 | Lo et al. | |
| 2009/0072382 A1 | 3/2009 | Guzek | |
| 2009/0079064 A1 | 3/2009 | Tang et al. | |
| 2009/0121347 A1 | 5/2009 | Kasai et al. | |
| 2009/0152743 A1 | 6/2009 | Jomaa et al. | |
| 2009/0212416 A1 | 8/2009 | Skeete | |
| 2009/0236031 A1 | 9/2009 | Sunohara et al. | |
| 2010/0013101 A1 | 1/2010 | Hedler et al. | |
| 2010/0044855 A1 | 2/2010 | Eichelberger et al. | |
| 2010/0047970 A1 | 2/2010 | Eichelberger et al. | |
| 2010/0073894 A1 | 3/2010 | Mortensen et al. | |
| 2010/0127394 A1 | 5/2010 | Ramiah et al. | |
| 2010/0216280 A1 | 8/2010 | Smeys et al. | |
| 2010/0237481 A1 | 9/2010 | Chi et al. | |
| 2011/0089546 A1 | 4/2011 | Bayan | |
| 2011/0101491 A1 | 5/2011 | Skeete et al. | |
| 2011/0108999 A1 | 5/2011 | Nalla et al. | |
| 2011/0121449 A1 | 5/2011 | Lin et al. | |
| 2011/0156231 A1 | 6/2011 | Guzek | |
| 2011/0156235 A1 | 6/2011 | Yuan | |
| 2011/0156261 A1 | 6/2011 | Kapusta et al. | |
| 2011/0215464 A1 | 9/2011 | Guzek et al. | |
| 2011/0221069 A1 | 9/2011 | Kunimoto | |
| 2011/0228464 A1 | 9/2011 | Guzek et al. | |
| 2011/0241186 A1 | 10/2011 | Nalla et al. | |
| 2011/0241195 A1 | 10/2011 | Nalla et al. | |
| 2011/0254124 A1 | 10/2011 | Nalla et al. | |
| 2011/0281375 A1 | 11/2011 | Swaminathan et al. | |
| 2011/0316140 A1 | 12/2011 | Nalla et al. | |
| 2012/0001339 A1 | 1/2012 | Malatkar | |
| 2012/0005887 A1 | 1/2012 | Mortensen et al. | |
| 2012/0009738 A1 | 1/2012 | Crawford et al. | |
| 2012/0074581 A1 | 3/2012 | Guzek et al. | |
| 2012/0112336 A1 | 5/2012 | Guzek et al. | |
| 2012/0139095 A1 | 6/2012 | Manusharow et al. | |

(56) References Cited

U.S. PATENT DOCUMENTS

| | | |
|---|---|---|
| 2012/0139116 A1 | 6/2012 | Manusharow et al. |
| 2012/0286425 A1* | 11/2012 | Chan et al. .................. 257/738 |
| 2012/0326271 A1 | 12/2012 | Teh et al. |
| 2013/0203265 A1 | 8/2013 | Hsiao |
| 2013/0270719 A1 | 10/2013 | Malatkar et al. |
| 2013/0328207 A1 | 12/2013 | Sankman et al. |
| 2015/0145138 A1 | 5/2015 | Sankman et al. |

FOREIGN PATENT DOCUMENTS

| | | |
|---|---|---|
| JP | 2004-200201 A | 7/2004 |
| JP | 2012-074536 A | 4/2012 |
| KR | 10-1999-0007859 A | 1/1999 |
| KR | 1020100038232 A | 4/2010 |
| KR | 1020100105506 A | 9/2010 |
| TW | 200509321 A | 3/2005 |
| TW | 200903756 A | 1/2009 |
| WO | 2006/010115 A2 | 1/2006 |
| WO | 2013/003257 A2 | 1/2013 |
| WO | 2013/003695 A2 | 1/2013 |
| WO | 2013/003257 A3 | 3/2013 |
| WO | 2013/003695 A3 | 5/2013 |
| WO | 2013/172814 A1 | 11/2013 |
| WO | 2013/184145 A1 | 12/2013 |

OTHER PUBLICATIONS

Office Action received for Taiwan Patent Application No. 101119764, mailed on Mar. 24, 2014, 15 pages of Office Action including 9 pages of English Translation.

Ma, Qing, "Direct Build-Up Layer on an Encapsulated Die Package", U.S. Appl. No. 09/640,961, filed Aug. 16, 2000, 70 pages.

International Search Report and Written Opinion received for PCT Patent Application No. PCT/US2012/037787, mailed on Jul. 26, 2013, 11 pages.

International Search Report and Written Opinion received for PCT Patent Application No. PCT/US2012/041714, mailed on Feb. 26, 2013, 10 pages.

International Preliminary Report on Patentability and Written Opinion received for PCT Patent Application No. PCT/US2012/043945, mailed on Jan. 16, 2014, 9 pages.

International Search Report and Written Opinion received for PCT Patent Application No. PCT/US2012/043945, mailed on Jan. 10, 2013, 12 pages.

International Preliminary Report on Patentability received for Patent Application No. PCT/US2012/044871, mailed on Jan. 16, 2014, 7 pages.

International Search Report and Written Opinion received for PCT Patent Application No. PCT/US2012/044871, mailed on Jan. 10, 2013, 10 pages.

Office Action received for Taiwan Patent Application No. 102115911, mailed on Feb. 26, 2015, 8 pages of English Translation and 10 pages of Taiwan Office Action.

Office Action received for Japanese Patent Application No. 2014-517243, mailed on Mar. 3, 2015, 5 pages of English Translation and 5 pages of Japanese Office Action.

International Preliminary Report on Patentability and Written Opinion received for PCT Patent Application No. PCT/US2012/037787, mailed on Nov. 27, 2014, 8 pages.

International Preliminary Report on Patentability and Written Opinion received for PCT Patent Application No. PCT/US2012/041714, mailed on Dec. 18, 2014, 7 pages.

Office Action and Search Report received for Taiwanese Patent Application No. 101120105, mailed on Apr. 13, 2016, 5 pages of Office Action including 1 Page of Translated Search Report.

Notice of Allowance Received for Chinese Patent Application No. 201280032555.3, mailed on Apr. 7, 2016, 4 pages of Notice of Allowance including 2 pages of English Translation.

Office Action received for Chinese Patent Application No. 201280032555.3, mailed on Oct. 27, 2015, 6 pages of Chinese Office Action only.

* cited by examiner

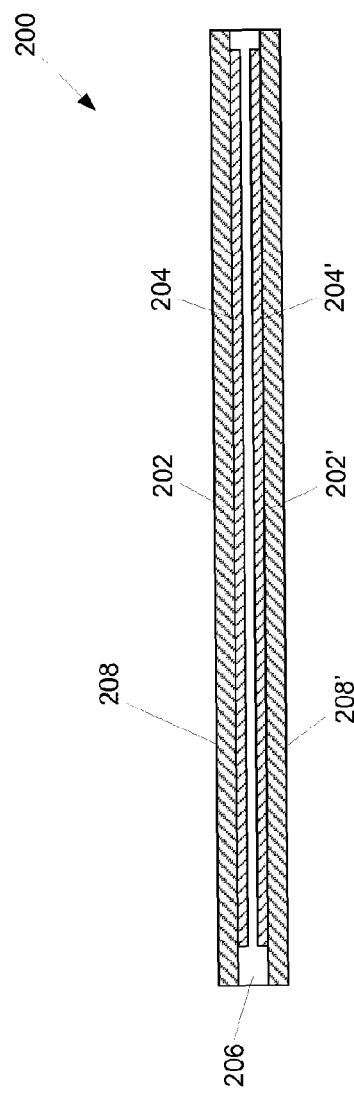
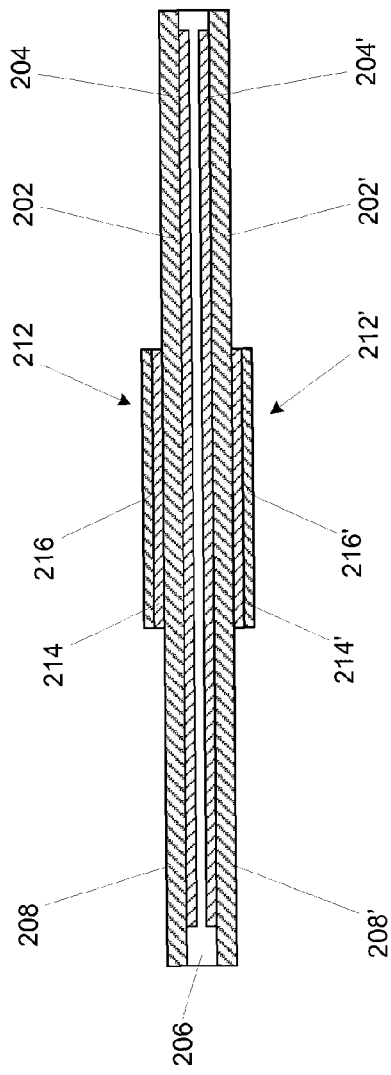
FIG. 3
FIG. 4

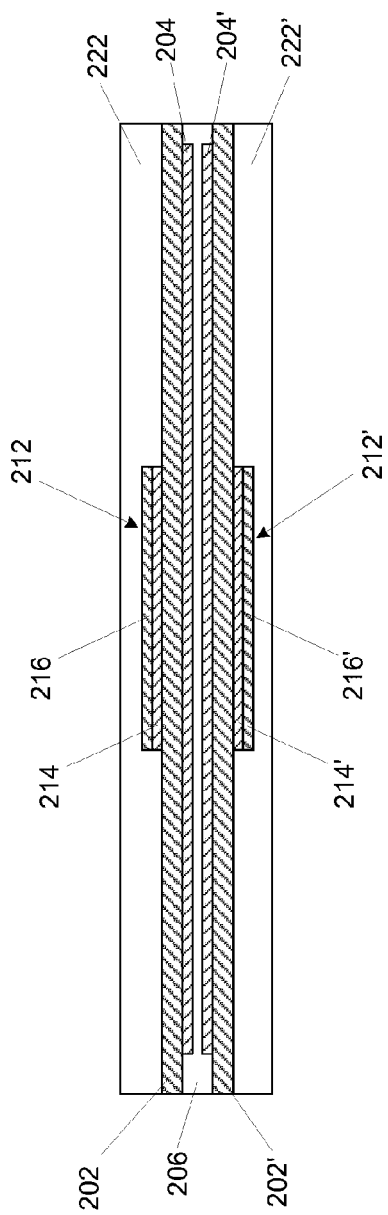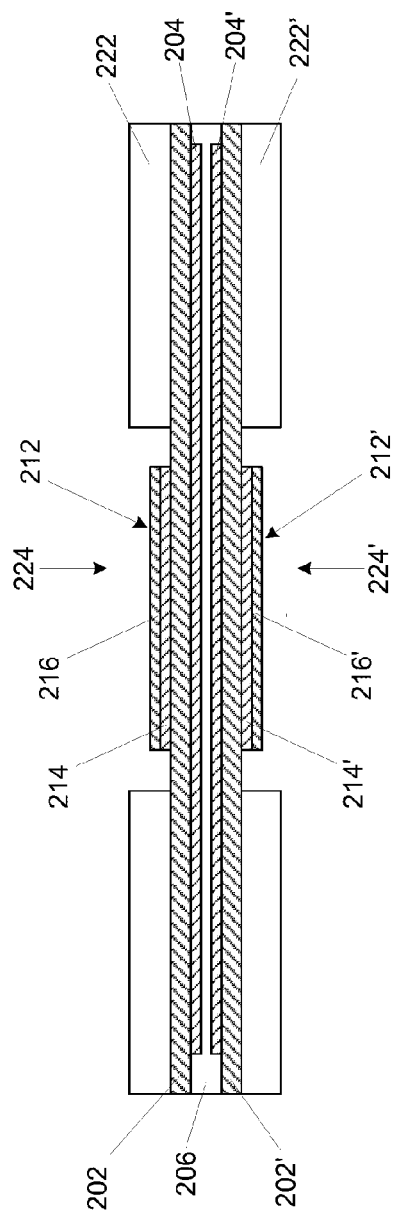

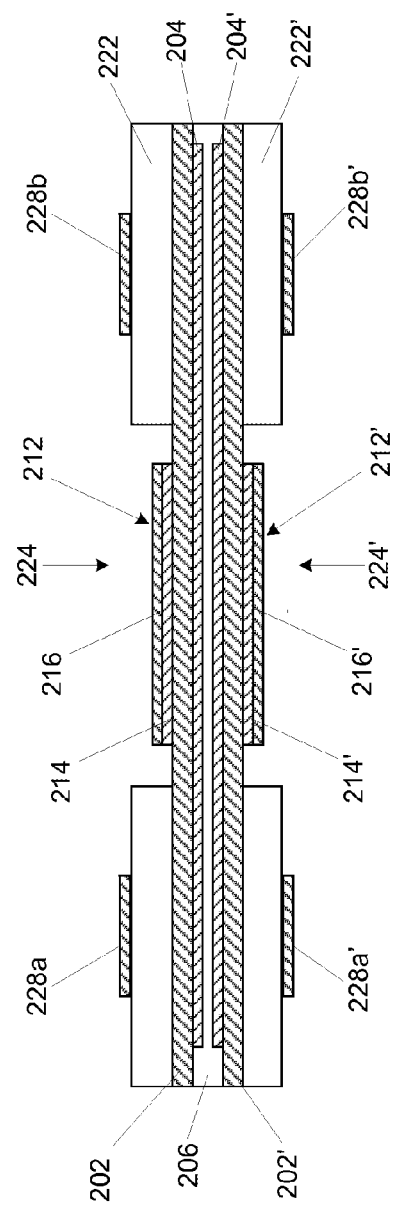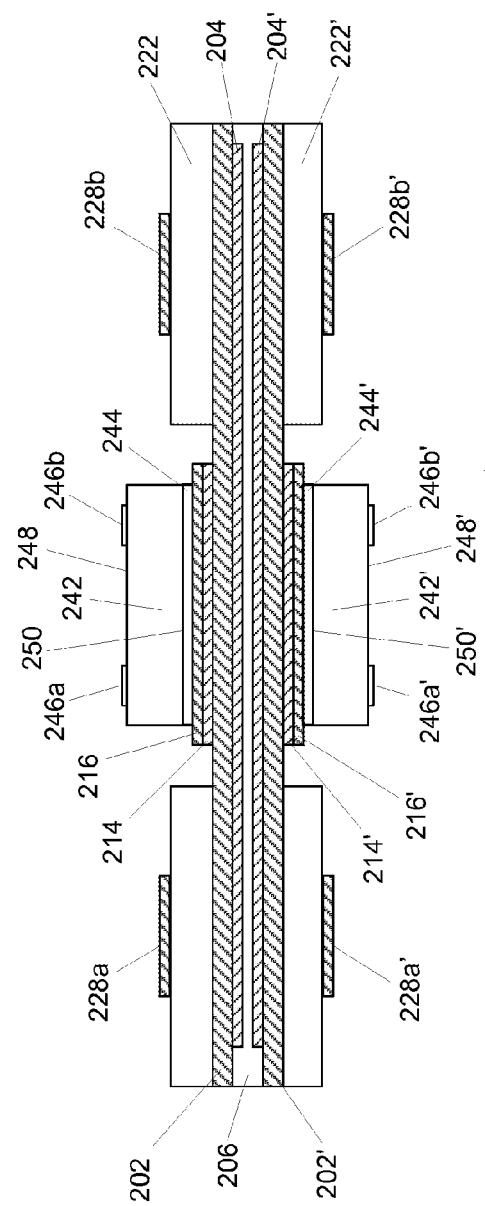

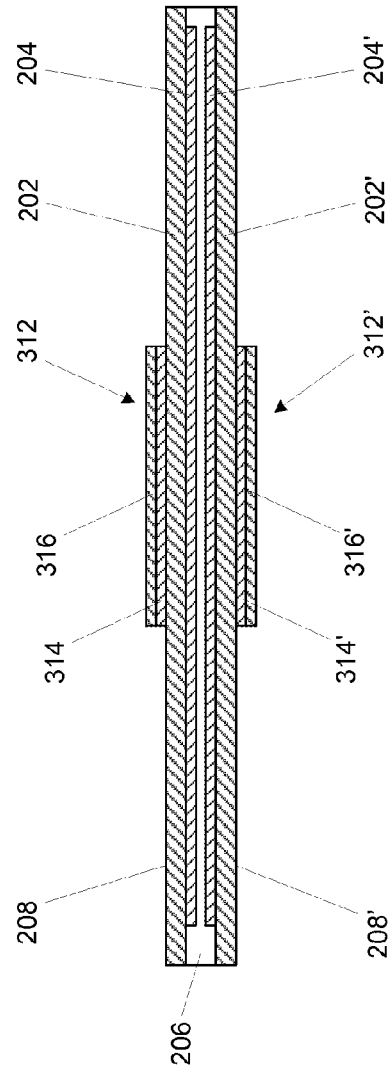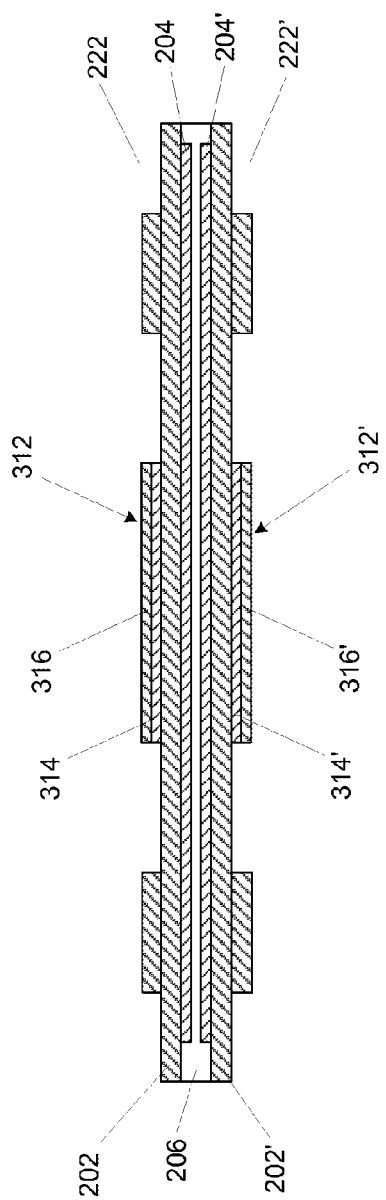

BUMPLESS BUILD-UP LAYER PACKAGE WARPAGE REDUCTION

RELATED PARAGRAPH

This application is a divisional of U.S. patent application Ser. No. 13/173,327, entitled "BUMPLESS BUILD-UP LAYER PACKAGE WARPAGE REDUCTION," filed on Jun. 30, 2011.

BACKGROUND

Embodiments of the present description generally relate to the field of microelectronic device package designs and, more particularly, to a microelectronic device package having a bumpless build-up layer (BBUL) design.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 3-13 illustrate cross-sectional views of a process of forming a cavity-type bumpless build-up layer coreless microelectronic package, according to an embodiment of the present description.

FIGS. 14-20 illustrate cross-sectional views of a process of forming an embedded-type bumpless build-up layer coreless microelectronic package, according to an embodiment of the present description.

DETAILED DESCRIPTION

Figure 1:
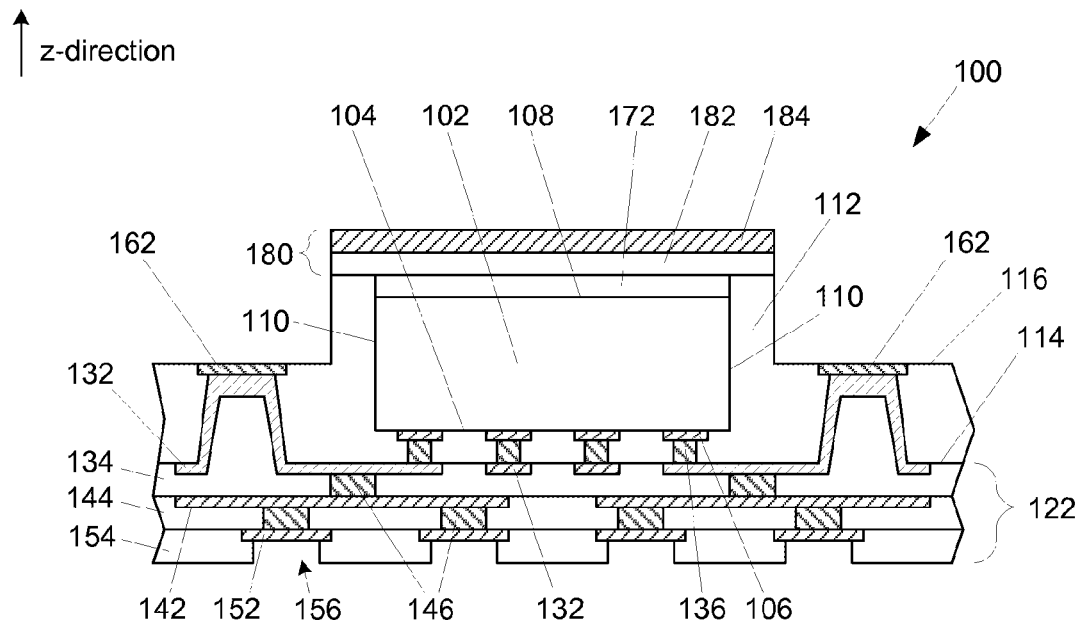
FIG. 1 illustrates a side cross-sectional view of a bumpless build-up layer coreless microelectronic package, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages and the fabrication thereof, wherein a microelectronic device may be formed within a bumpless build-up layer coreless (BBUL-C) microelectronic package and wherein a warpage control structure may be disposed on a back surface of the microelectronic device. The warpage control structure may be a layered structure comprising at least one layer of high coefficient of thermal expansion material, including but not limited to silica-filled epoxy material, and at least one high elastic modulus material layer, such as a metal layer. Such a warpage control structure may be effective in reducing warpage of the bumpless build-up layer coreless microelectronic package both at room temperature (about 25 degrees Celsius) and at reflow temperature (for example, about 260 degrees Celsius). Reflow temperature is temperature to which interconnection solder structures are heated to attach the microelectronic package to external devices, such as a motherboard.

As will be understood to those skilled in the art, a reduction in warpage may reduce the potential of microelectronic device damage and/or connection issues during the attachment of microelectronic package to external devices. Furthermore, the performance of microelectronic devices within the microelectronic packages may be improved due to a reduction of in-plane compressive stresses on transistors within the microelectronic devices resulting from a reduction in warpage.

FIG. 1 illustrates a cross-sectional view of an embodiment of a cavity-type bumpless build-up layer coreless (BBUL-C) microelectronic package. As shown in FIG. 1, a microelectronic package 100 may include a microelectronic device 102 substantially encased in an encapsulation material 112, wherein the encapsulation material 112 may abut at least a portion of an active surface 104 of the microelectronic device 102 and at least one side 110 of the microelectronic device 102. The microelectronic active surface 104 may have at least one contact land 106 formed therein and/or thereon. The microelectronic device 102 may be any desired device, including but not limited to a microprocessor (single or multi-core), a memory device, a chipset, a graphics device, an application specific integrated circuit, or the like. The encapsulation material 112 may be a silica-filled epoxy, such as build-up films available from Ajinomoto Fine-Techno Co., Inc., 1-2 Suzuki-cho, Kawasaki-ku, Kawasaki-shi, 210-0801, Japan (e.g. Ajinomoto ABF-GX13, Ajinomoto GX92, and the like).

A build-up layer 122 may be formed on a first surface 114 of the encapsulation material 112 proximate the microelectronic device active surface 104. The build-up layer 122 may comprise a plurality of dielectric layers with conductive traces formed adjacent each dielectric layer with conductive vias extending through each dielectric layer to connect the conductive traces on different layers. Referring to FIG. 1, the build-up layer 122 may comprise at least one first layer conductive trace 132 with a first build-up dielectric layer 134 formed adjacent the first layer conductive trace 132 and the encapsulation material 112. At least one trace-to-device conductive via 136 may extend through the first build-up dielectric layer 134 to connect at least one first layer conductive trace 132 to at least one microelectronic device contact land 106. At least one second layer conductive trace 142 may be formed adjacent the first build-up dielectric layer 134 and a second build-up dielectric layer 144 may be formed adjacent the second layer conductive traces 142 and the first build-up dielectric layer 134. At least one trace-to-trace conductive via 146 may extend through the first build-up dielectric layer 134 to connect at least one first layer conductive trace 132 to at least one second layer conductive trace 142. At least one third layer conductive trace 152 may be formed on the second build-up dielectric layer 144 and at least one trace-to-trace conductive via 146 may extend through the second build-up dielectric layer 144 to connect at least one second layer conductive trace 142 to at least one third layer conductive trace 152. A solder resist material 154 may be patterned on the second build-up dielectric layer 144 and third layer conductive traces 152 having at least one opening 156 exposing at least a portion of the third layer conductive trace 152. It is understood that interconnection structures (not shown), such as solder balls, may be formed on the third layer conductive trace(s) 152 through the solder resist material opening(s) 156.

At least one package-on-package (PoP) pad 162 may be formed on and/or in a second surface 116 (substantially opposing the encapsulation material first surface 114) of the encapsulation material 112. The package-on-package pad 162 may be electrically connected to at least one first layer conductive traces 132. As will be understood those skilled in the art, the package-on-package pads may be used to form connections between microelectronic device packages in a z-direction for stacking (e.g. referred to as 3D stacking), without the need for through silicon vias.

As shown in FIG. 1, a die backside film 172, such as Nitto NX2 DBF material, available from Nitto Denko, 110-1-1, Funayose, Maruoka, Sakai, Fukui, 910-0381, Japan, may be disposed on a back surface 108 of the first microelectronic device 102. A warpage control structure 180 may be disposed on the die backside film 172, wherein the warpage control structure 180 may comprise a high coefficient of thermal expansion (CTE) material layer 182 disposed on the die backside film 172 and a high elastic modulus material layer 184 disposed on the high CTE material layer 182. The high CTE material layer 182 may include, but is not limited to, filled epoxies, such a silica-filled epoxy, including but not limited to Ajinomoto ABF-GX13, Ajinomoto GX92, and the like, available from Ajinomoto Fine-Techno Co., Inc., 1-2 Suzuki-cho, Kawasaki-ku, Kawasaki-shi, 210-0801, Japan. The high elastic modulus material layer 184 may include, but is not limited to, a metal layer, such as copper, nickel, aluminum, and alloys thereof. In one embodiment, the high CTE material layer 182 and the high elastic modulus material layer 184 may be the same or similar to materials used in other areas for the microelectronic package 100, essentially making the microelectronic package 100 more symmetric (e.g. less prone to warpage). In one embodiment, the warpage control structure 180 comprises the high CTE material layer 182 comprising a silica-filled epoxy at between about 5 μm and 50 μm in thickness, and, in specific about 30 μm in thickness and the high elastic modulus material layer 184 comprising copper at between about 5 μm and 50 μm in thickness.

A layered structure with both a high CTE material layer and a high elastic modulus layer disposed on a microelectronic device should lead to a lower package warpage. In one embodiment, the high CTE material layer 182 may be greater than about 25 micrometer per meter per degree Celsius ("ppm/° C.") and the high elastic modulus material layer 184 may be greater that about 5 gigaPascals ("GPa"). It is understood that the minimum CTE and elastic modulus values necessary may change with the thickness of the microelectronic device, the thickness of the resulting microelectronic package, and/or the thickness of the material layers. The minimum CTE values are related to the temperature of interest, as the CTE value of most epoxy materials before their glass transition temperature (denoted by $CTE_1$) and after their glass transition temperature (denoted by $CTE_2$) may be quite different. If the temperature at which package warpage needs to be controlled (e.g. room temperature or reflow temperature) is below the glass transition temperature of the material to be disposed, then the minimum CTE value would refer to that of $CTE_1$, and if above the glass transition temperature, then the minimum CTE value refers to that of $CTE_2$. The minimum modulus value always refers to the modulus at the temperature of interest.

In one embodiment of the present description, the warpage control structure 180 may be sufficiently thin to fit within the gap between a top package (not shown) and a bottom package (e.g. microelectronic package 100) in a stacked package configuration (not shown) and thus does not add to the overall z-height of the stacked package configuration (not shown), as will be understood to those skilled in the art. In another embodiment, the high CTE material layer 182 and the high elastic modulus material layer 184 may be selected such that warpage may be reduction both at room temperature (about 25 degrees Celsius) and at reflow temperatures (for example, about 260 degrees Celsius).

Figure 2:
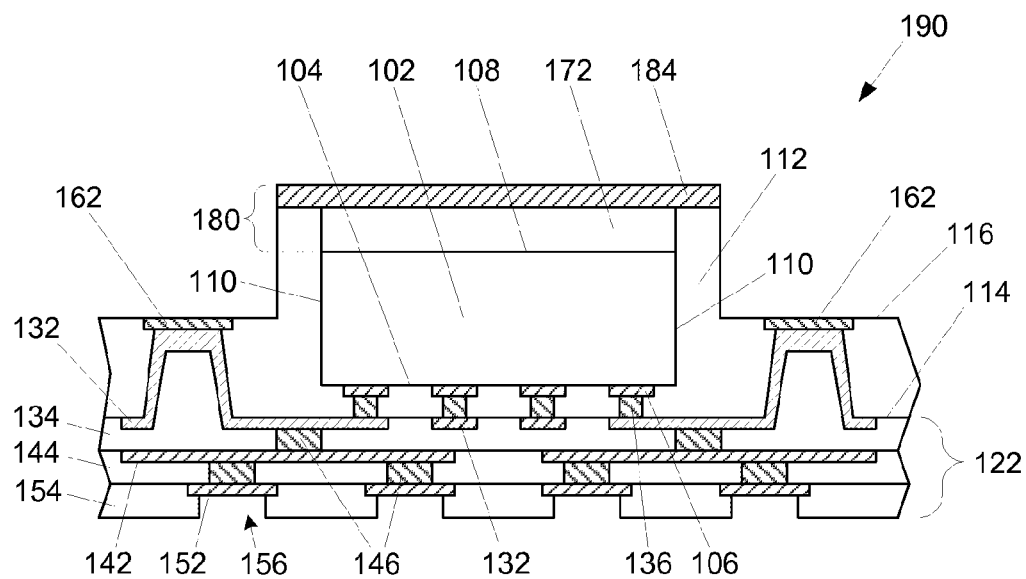
FIG. 2 illustrates a side cross-sectional view of a bumpless build-up layer coreless microelectronic package, according to another embodiment of the present description.

As shown in FIG. 2, the die backside film (illustrated as element 172 in FIG. 1) may itself serve as the high CTE material layer. In one embodiment, a warpage control structure 190 may be disposed directly on the microelectronic device back surface 108, wherein the warpage control structure 180 may comprise the high CTE material layer 182 disposed on the microelectronic device back surface 108 and a high elastic modulus material layer 184 disposed on the high CTE material layer 182. The high CTE material layer 182 may include, but is not limited to die backside films or adhesive materials, such as Nitto NX2 DBF material, available from Nitto Denko, 110-1-1, Funayose, Maruoka, Sakai, Fukui, 910-0381, Japan, or NEX series materials (e.g. NEX-130CTX, NEX140DBF) available from Nippon Steel Chemical Co., Ltd., 14-1, Sotokanda 4-Chome, Chiyoda-ku, Tokyo 101-0021, Japan. The high elastic modulus material layer 184 may include, but is not limited to, a metal layer, such as copper, nickel, aluminum, and alloys thereof.

FIGS. 3-13 illustrate cross-sectional views of an embodiment of a process of forming a cavity-type bumpless build-up layer coreless (BBUL-C) microelectronic package. As shown in FIG. 3, a carrier 200 may be provided. The carrier 200 illustrated may be a copper laminated substrate comprising a core material 206 disposed between two opposing copper release layers (i.e. a first copper release layer 204 and a second copper release layer 204') with a two opposing copper layers (i.e. a first copper layer 202 and a second copper layer 202') abutting their respective copper release layers (i.e. the first copper release layer 204 and the second copper release layer 204') and abutting a portion of the core material 206, wherein the exterior surface of the first copper layer 202 defines a first surface 208 of the carrier 200 and the exterior surface of the second copper layer 202' defines a second surface 208' of the carrier 200. The core material 206 may be any appropriate material, including but not limited to an pre-impregnated composite fiber material. It is understood that although the layers laminated with the core material 206 are specifically identified as copper layers (i.e. the copper layers and the copper release layers), the present description is not so limited, as the layers may be made of any appropriate material.

As shown in FIG. 4, a first microelectronic device attachment pad 212 may be formed on the carrier first surface 208 and a second microelectronic device attachment pad 212' may be formed on the carrier second surface 208'. As further shown in FIG. 4, the first microelectronic device attachment pad 212 may be a layered structure of a first protective layer 214, as such as a first nickel layer, abutting the carrier first surface 208 and a first high elastic modulus material layer 216, such as a first copper layer, abutting the first protective layer 214, and the second microelectronic device attachment pad 212' may also be a layered structure of a second protective layer 214', such as a second nickel layer, abutting the carrier second surface 208' and a second high elastic modulus material layer 216' abutting the second protective layer 214'. The first protective layer 214 and the second protective layer 214' may be used to prevent the formation of oxides on the first high elastic modulus material layer 216 and the second high elastic modulus material layer 216', respectively, and to prevent the etching of the first high elastic modulus material layer 216 and the second high elastic modulus material layer 216' during subsequent fabrication processes, as will be discussed.

As shown in FIG. 5, a first sacrificial material layer 222, such as a photoresist material, may be formed on the carrier first surface 208 and on the first microelectronic device attachment pad 212; and a second sacrificial material layer 222', such as a photoresist material, may be formed on the carrier second surface 208' and on the second microelectronic device attachment pad 212'. The first sacrificial material layer 222 and the second sacrificial material layer 222' may be formed by any technique known in the art, including but not limited to spin coating, dry photofilm lamination, and chemical vapor deposition.

As shown in FIG. 6, an opening 224 may be formed through the first sacrificial material layer 222 to expose the first microelectronic device attachment pad 212 and a portion of the carrier first surface 208. An opening 224' may be formed simultaneously through the second sacrificial material layer 222' to expose the second microelectronic device attachment pad 212' and a portion of the carrier second surface 208'. The first sacrificial material layer opening 224 and the second sacrificial material layer opening 224' may be formed by any technique known in the art, including but not limited to photolithographic processes and wet or dry etching.

As shown in FIG. 7, package-on-package (PoP) pads may be formed on first sacrificial material layer 222 and the second sacrificial material layer 222'. FIG. 7 illustrates a first package-on-package pad 228a and a second package-on-package pad 228b formed on the first sacrificial material layer 222, and a third package-on-package pad 228a' and a fourth package-on-package pad 228b' formed on the second sacrificial material layer 222'. The package-on-package pads (e.g., elements 228a, 228b, 228a', and 228b') may be layered metal structures, such as a layers of gold, nickel and copper, which may be patterned by any technique known in the art, including but not limited to plating. As will be understood those skilled in the art, the package-on-package pads may be used to form connections between microelectronic device packages in a z-direction (see FIG. 1) for stacking (e.g. referred to as 3D stacking), without the need for through silicon vias.

As shown in FIG. 8, a first microelectronic device 242 may be attached by a back surface 250 thereof with a high CTE material layer 244 to the carrier first surface 208 within the first sacrificial material layer opening 224. The first microelectronic device 242 may have at least one contact land (shown as elements 246a and 246b) on an active surface 248 thereof. A second microelectronic device 242' may be attached by a back surface 250' with a high CTE material layer 244' to the carrier second surface 208' within the second sacrificial material layer opening 224'. The second microelectronic device 242' may have at least one contact land (shown as elements 246a' and 246b') on an active surface 248' thereof. The first microelectronic device 242 and the second microelectronic device 242' may be any desired device, including but not limited to a microprocessor (single or multi-core), a memory device, a chipset, a graphics device, an application specific integrated circuit, or the like. The high CTE material layers 244 and 244' may be any appropriate material, including but not limited to die backside film materials.

Figure 9:
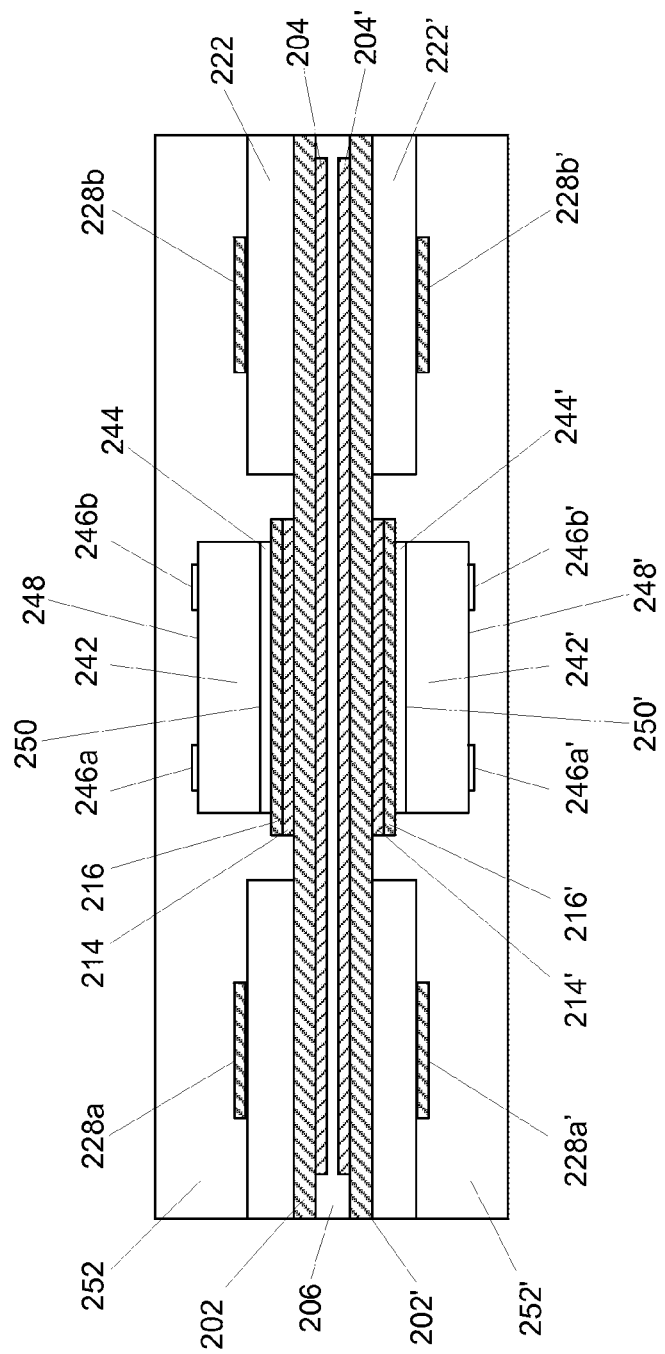

As shown in FIG. 9, a first encapsulation layer 252 may be formed on the first microelectronic device 242, the first sacrificial material layer opening 224, the first package-on-package pad 228a, and the second package-on-package pad 228b. A second encapsulation layer 252' may be simultaneously formed on the second microelectronic device 242', the second sacrificial material layer opening 224', the third package-on-package pad 228a', and the fourth package-on-package pad 228b'. In one embodiment, the first encapsulation layer 252 and the second encapsulation layer 252' may comprise silica-filled epoxy.

Figure 10:
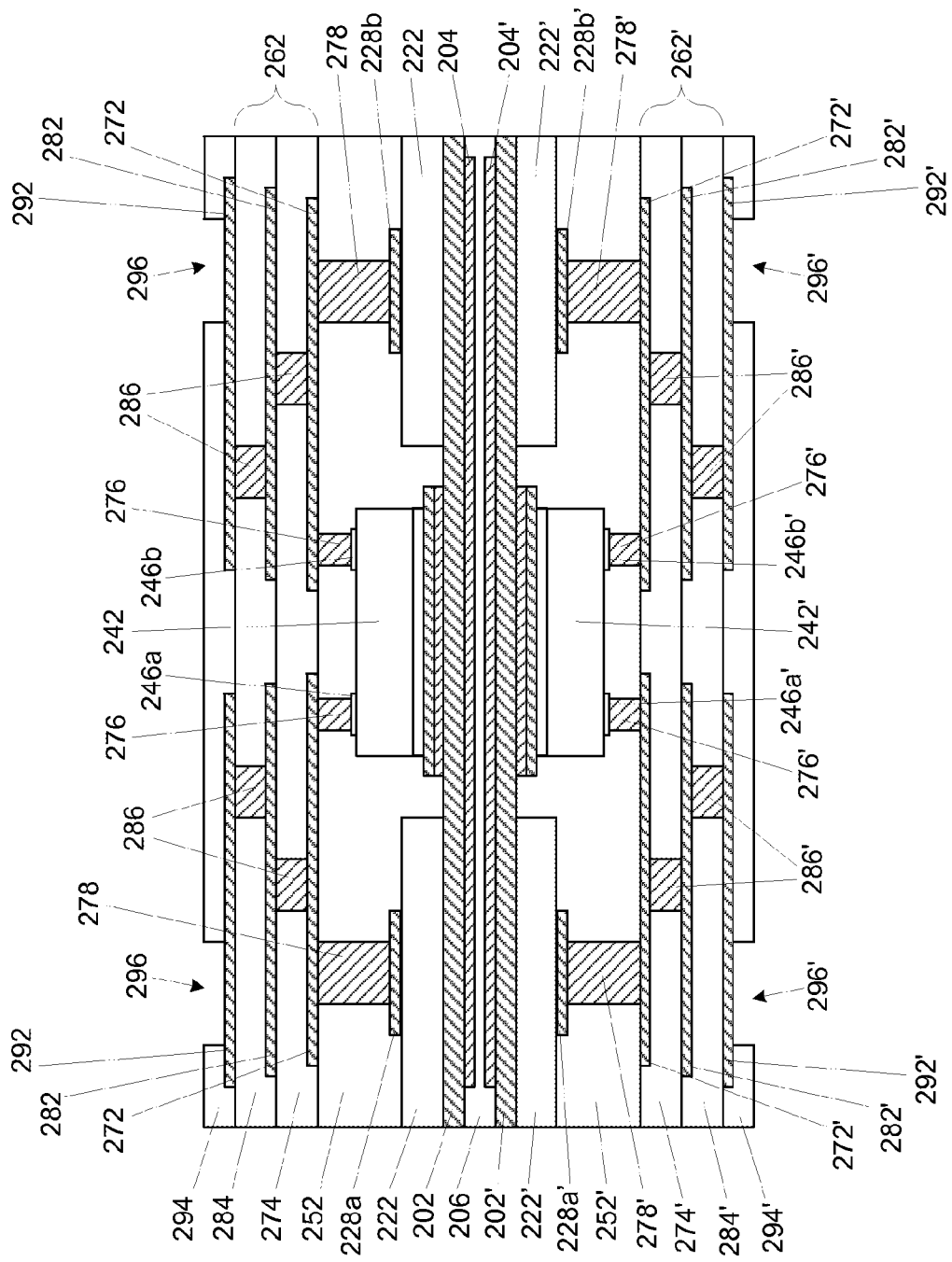

As shown in FIG. 10, a first build-up layer 262 may be formed on the first encapsulation layer 252. The first build-up layer 262 may comprise a plurality of dielectric layers with conductive traces formed adjacent each dielectric layer with conductive vias extending through each dielectric layer to connect the conductive traces on different layers. Referring to FIG. 10, the first build-up layer 262 may comprise at least one first layer conductive trace 272 with a first build-up dielectric layer 274 formed adjacent the first layer conductive trace 272 and the first encapsulation layer 252. At least one trace-to-device conductive via 276 may extend through the first build-up dielectric layer 274 to connect at least one first layer conductive trace 272 to at least one microelectronic device contact land (e.g. elements 246a and 246b). At least one trace-to-pad conductive via 278 may extend through the first build-up dielectric layer 274 to connect at least one first layer conductive trace 272 to at least one package-on-package pad (e.g., elements 228a and 228b). At least one second layer conductive trace 282 may be formed adjacent the first build-up dielectric layer 274 and a second build-up dielectric layer 284 may be formed adjacent the second layer conductive traces 282 and the first build-up dielectric layer 274. At least one trace-to-trace conductive via 286 may extend through the first build-up dielectric layer 274 to connect at least one first layer conductive trace 272 to at least one second layer conductive trace 282. At least one third layer conductive trace 292 may be formed on the second build-up dielectric layer 284 and at least one traceto-trace conductive via 286 may extend through the second build-up dielectric layer 284 to connect at least one second layer conductive trace 282 to at least one third layer conductive trace 292. A solder resist material 294 may be patterned on the second build-up dielectric layer 284 and the third layer conductive traces 292 having at least one opening 296 exposing at least a portion of the third layer conductive trace 292. It is understood that interconnection structures (not shown), such as solder balls, may be formed on the third layer conductive trace(s) 292 through the solder resist material opening(s) 296.

As further shown in FIG. 10, a second build-up layer 262' may be formed on the second encapsulation layer 252'. The second build-up layer 262' may comprise a plurality of dielectric layers with conductive traces formed on each dielectric layer with conductive vias extending through each dielectric layer to connect the conductive traces on different layers. Referring to FIG. 10, the second build-up layer 262' may comprise at least one first layer conductive trace 272' with a first build-up dielectric layer 274' formed adjacent the first layer conductive trace 272' and the first encapsulation layer 252'. At least one trace-to-device conductive via 276' may extend through the first build-up dielectric layer 274' to connect at least one first layer conductive trace 272' to at least one microelectronic device contact land (e.g. elements 246a' and 246b'). At least one trace-to-pad conductive via 278' may extend through the first build-up dielectric layer 274' to connect at least one first layer conductive trace 272' to at least one package-on-package pad (e.g., elements 228a' and 228b'). At least one second layer conductive trace 282' may be formed adjacent the first build-up dielectric layer 274' and a second build-up dielectric layer 284' may be formed adjacent the second layer conductive traces 282' and the first build-up dielectric layer 274'. At least one trace-to-trace conductive via 286' may extend through the first build-up dielectric layer 274' to connect at least one first layer conductive trace 272' to at least one second layer conductive trace 282'. At least one third layer conductive trace 292' may be formed on the second build-up dielectric layer 284' and at least one trace-to-trace conductive via 286' may extend through the second build-up dielectric layer 284' to connect at least one second layer conductive trace 282' to at least one third layer conductive trace 292'. A solder resist material 294' may be patterned on the second build-up dielectric layer 284' and third layer conductive traces 292' having at least one opening 296' exposing at least a portion of the third layer conductive trace 292'. It is understood that interconnection structures (not shown), such as solder balls, may be formed on the third layer conductive trace(s) 292' through the solder resist material opening(s) 296'.

The conductive traces (e.g. elements 272, 272', 282, 282', 292, and 292') may be any appropriate conductive material including but not limited to copper, aluminum, silver, gold, and alloys thereof, and may be made by any technique known in the art, including but not limited to photolithography and plating. The conductive vias (e.g. elements 276, 276', 278, 278', 286, and 286') may be any appropriate conductive material including but not limited to copper, aluminum, silver, gold, and alloys thereof, and may be made by any technique known in the art, including but not limited to laser drilling, ion drilling, photolithography, plating, and deposition.

It is understood that the additional dielectric layers, conductive vias, and conductive traces may be built up to form a desired number of build-up layers.

Figure 11:
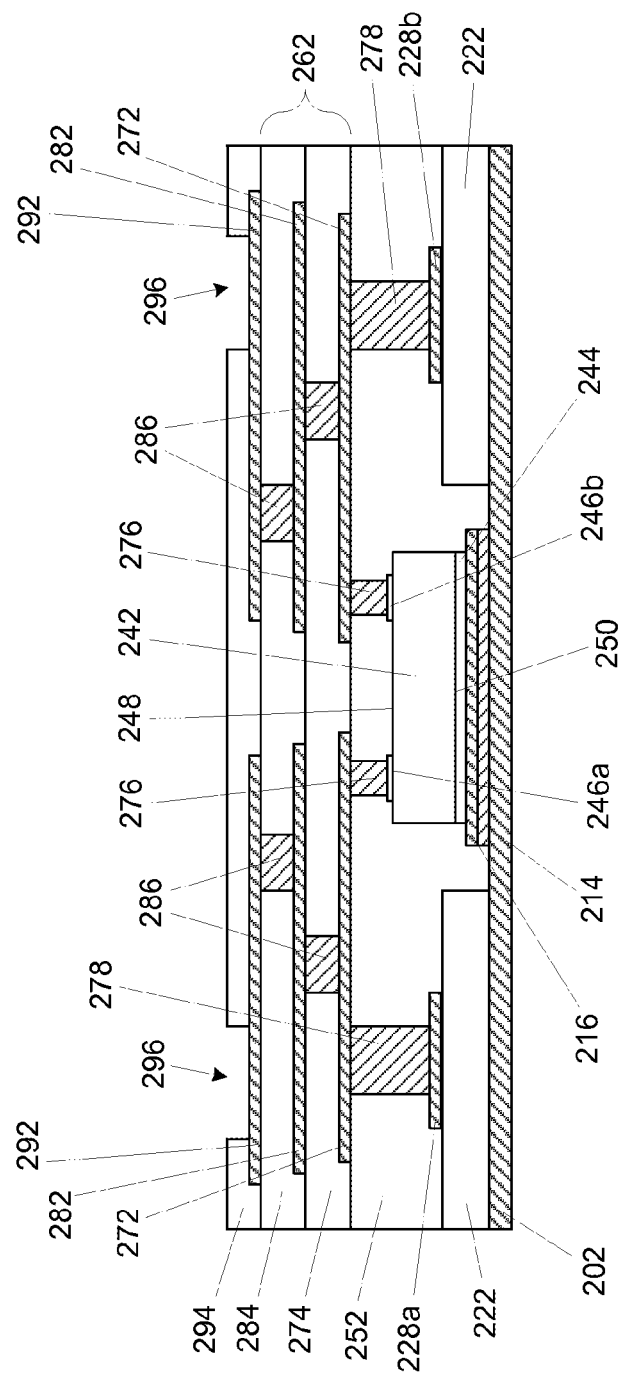
Figure 12:
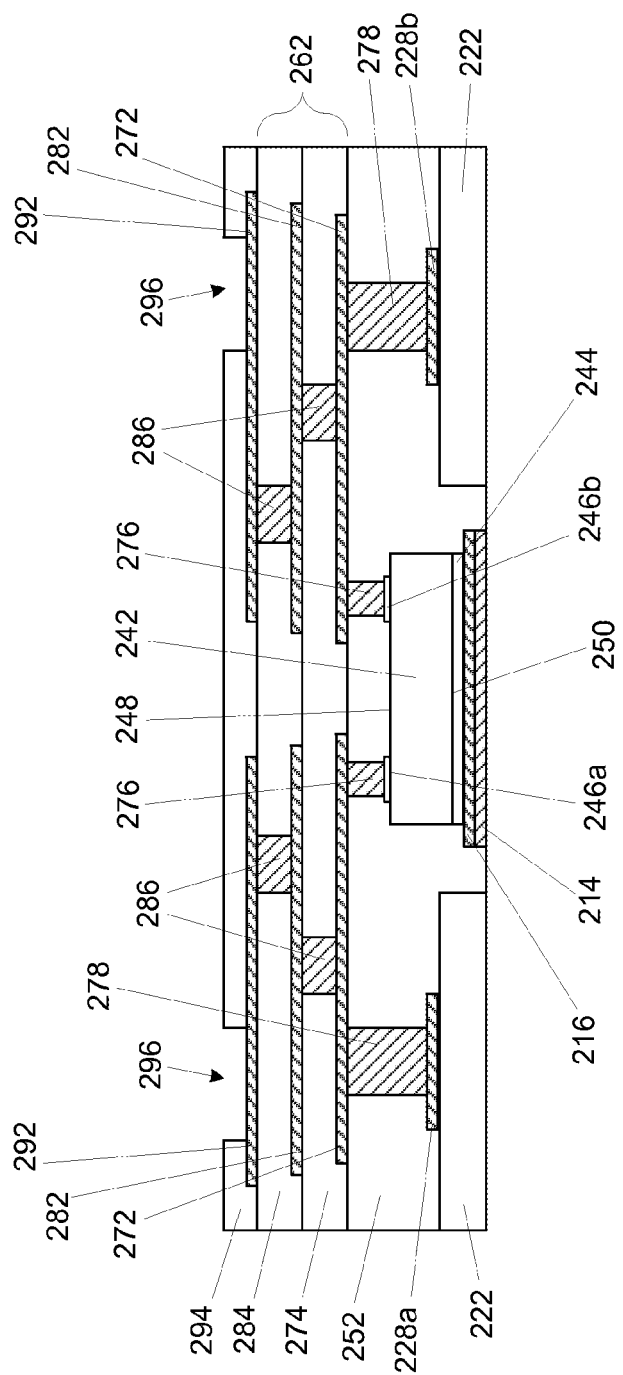
Figure 13:
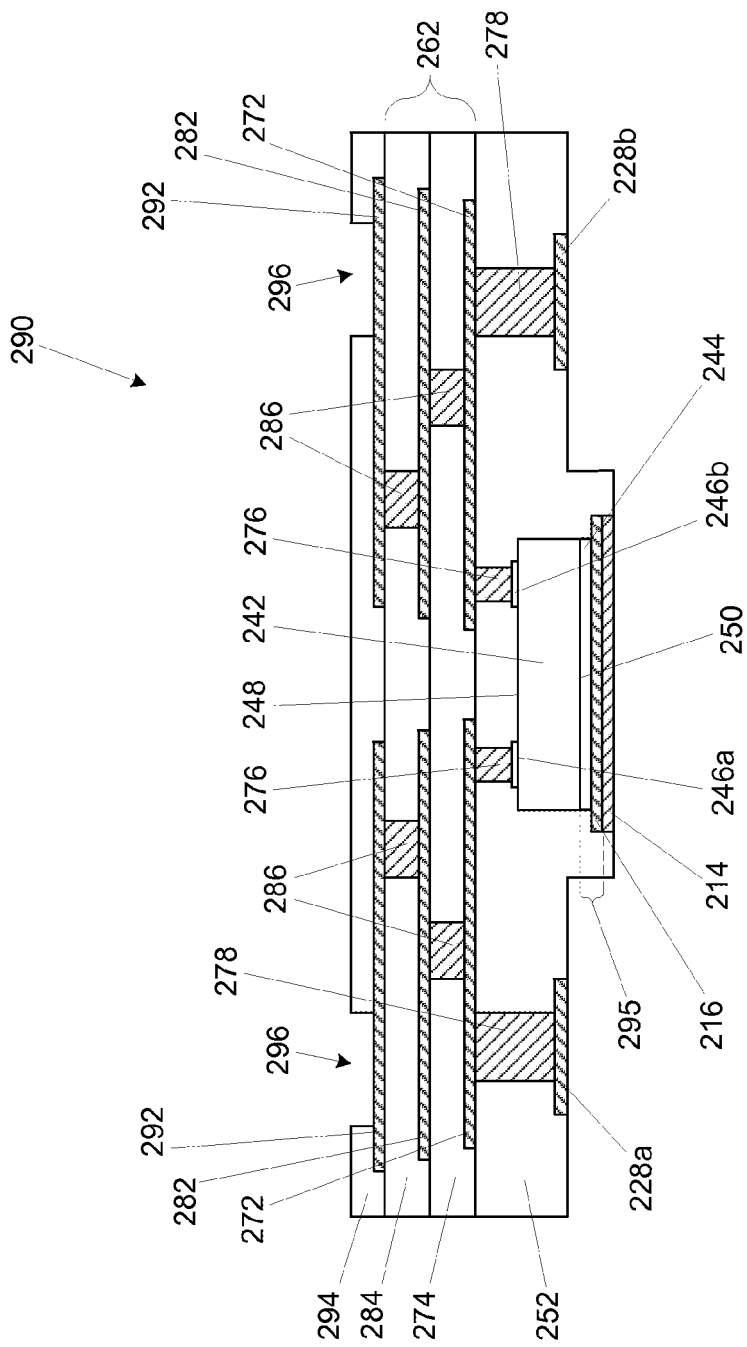

The structures thus formed on the carrier first surface 208 and on the carrier second surface 208' may be separated from one another with a depaneling process, as known in the art. FIG. 11 illustrates the structure formed on the carrier first surface 208 after depaneling. As shown in the FIG. 12, the copper layer 202 remaining from the carrier 200 after depaneling may be removed, such as by an etching process. As shown in FIG. 13, the first sacrificial material layer 222 may be removed, such as by plasma ashing, sand blasting, or solvent release, as will be understood to those skilled in the art, to form a microelectronic device package 290. Thus, the process of FIGS. 3-13 forms a warpage control structure 295 comprising at least the high CTE material layer 244 and the first high elastic modulus material layer 216.

Additional processing steps may be performed, including but not limited to singulation, stacking, and encapsulation, as will be understood to those skilled in the art.

FIGS. 14-25 illustrate cross-sectional views of another embodiment of a process of forming an embedded-type bumpless build-up layer coreless (BBUL-C) microelectronic package. As shown in FIG. 14, a carrier, such as the carrier 200 of FIG. 3, may be provided, and at least one stand-off may be formed on the carrier. As illustrated, a first microelectronic device attachment pad 312 may be formed on the carrier first surface 208 and a second microelectronic device attachment pad 312' may be formed on the carrier second surface 208'. As further shown in FIG. 14, the first microelectronic device attachment pad 312 may be a layered structure of a first protective layer 314, such as a nickel layer, abutting the carrier first surface 208 and a first high elastic modulus material layer 316, such as a copper layer, abutting the first protective layer 314, and the second microelectronic device attachment pad 312' may also be a layered structure of a second protective layer 314', such as a nickel layer, abutting the carrier second surface 208' and a second high elastic modulus material layer 316', such as a copper layer, abutting the second protective layer 314'.

As shown in FIG. 15, package-on-package (PoP) pads may be formed on the carrier first surface 208 and on the carrier second surface 208'. FIG. 15 illustrates a first package-on-package pad 328a and a second package-on-package pad 328b formed on the carrier first surface 208, and a third package-on-package pad 328a' and a fourth package-on-package pad 328b' formed on the carrier second surface 208'. The package-on-package pads (e.g., elements 328a, 328b, 328a', and 328b') may be layered metal structures, such as a layers of gold, nickel and copper, which may be patterned by any technique known in the art, including but not limited to plating.

Figure 16:
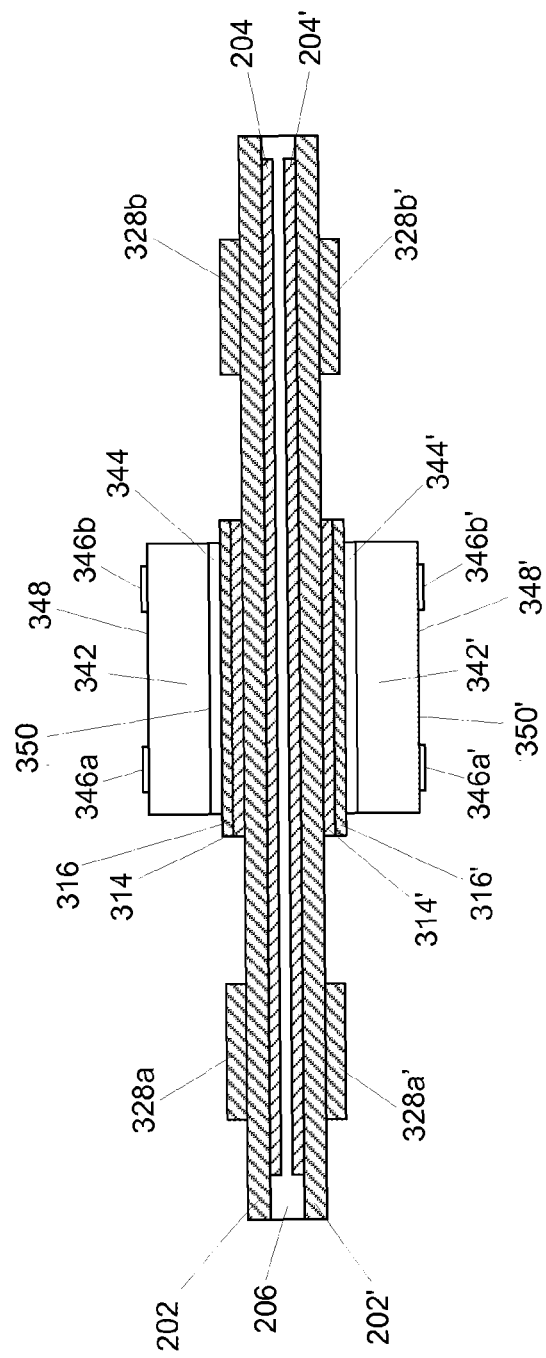

As shown in FIG. 16, a first microelectronic device 342 may be attached by a back surface 350 thereof with a high CTE material 344 to the first microelectronic device attachment pad 312. The first microelectronic device 342 may have at least one contact land (shown as elements 346a and 346b) on an active surface 348 thereof. A second microelectronic device 342' may be attached by a back surface 350' with a high CTE material 344' to the second microelectronic device attachment pad 312'. The second microelectronic device 342' may have at least one contact land (shown as elements 346a' and 346b') on an active surface 348' thereof. The first microelectronic device 342 and the second microelectronic device 342' may be any desired device, including but not limited to a microprocessor (single or multi-core), a memory device, a chipset, a graphics device, an application specific integrated circuit, or the like. The high CTE materials 344 and 344' may be any appropriate material, including but not limited to die backside materials.

Figure 17:
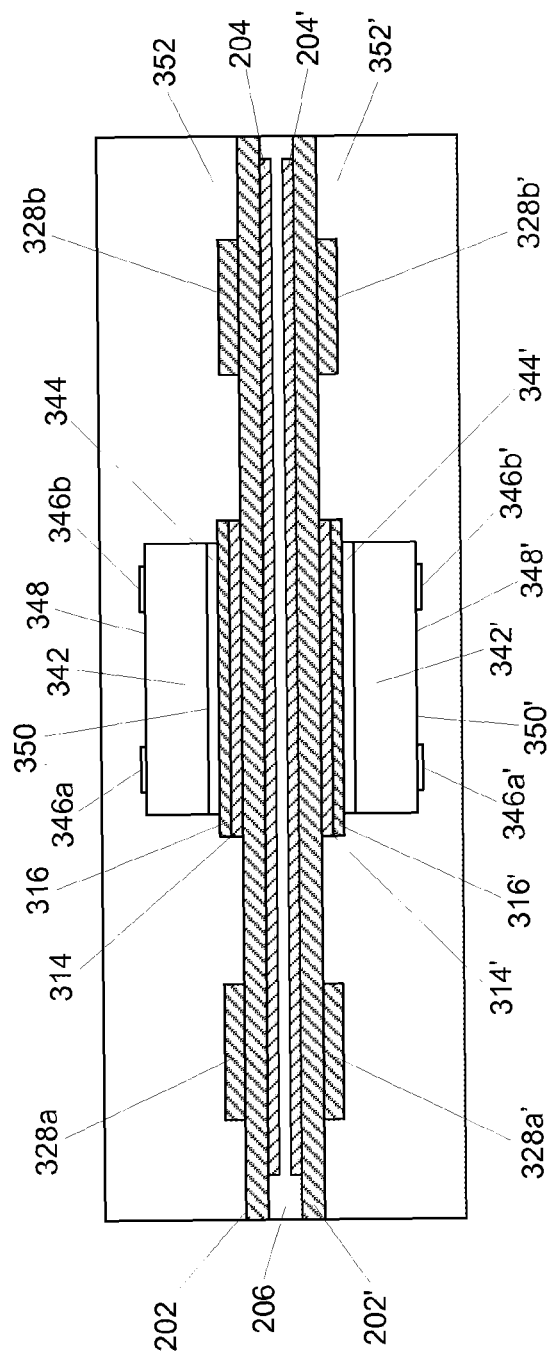

As shown in FIG. 17, a first encapsulation layer 352 may be formed on the first microelectronic device 342, the carrier first surface 208, the first package-on-package pad 328a, and the second package-on-package pad 328b. A second encapsulation layer 352' may be simultaneously formed on the second microelectronic device 342', the carrier second surface 208', the third package-on-package pad 328a', and the fourth package-on-package pad 328b'. In one embodiment, the first encapsulation layer 352 and the second encapsulation layer 352' may comprise silica-filled epoxy.

Figure 18:
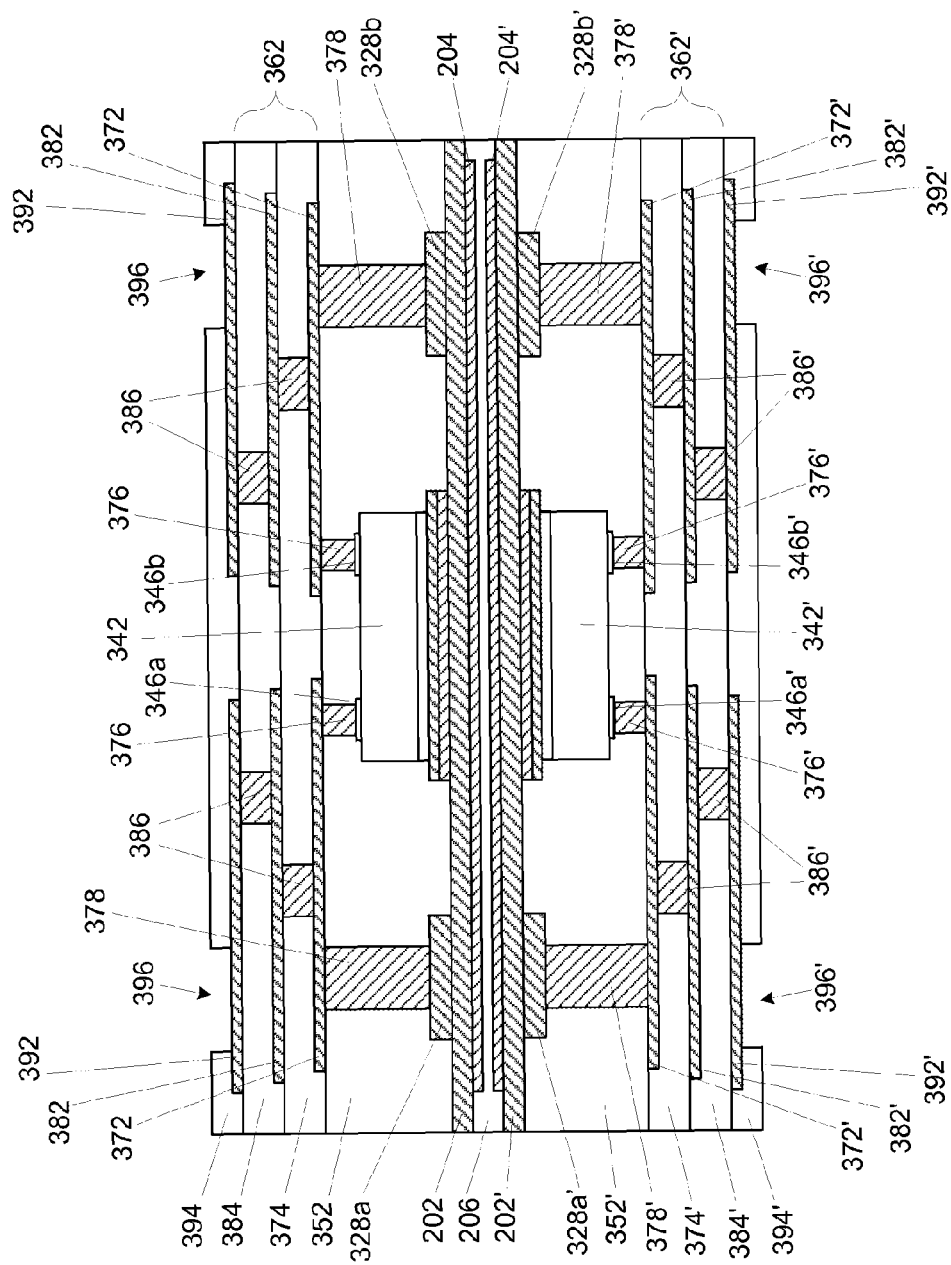

As shown in FIG. 18, a first build-up layer 362 may be formed on the first encapsulation layer 352. The first build-up layer 362 may comprise a plurality of dielectric layers with conductive traces formed adjacent each dielectric layer with conductive vias extending through each dielectric layer to connect the conductive traces on different layers. Referring to FIG. 18, the first build-up layer 362 may comprise at least one first layer conductive trace 372 with a first build-up dielectric layer 374 formed adjacent the first layer conductive traces 372 and the first encapsulation layer 352. At least one trace-to-device conductive via 376 may extend through the first build-up dielectric layer 374 to connect at least one first layer conductive trace 372 to at least one microelectronic device contact land (e.g. elements 346a and 346b). At least one trace-to-pad conductive via 378 may extend through the first build-up dielectric layer 374 to connect at least one first layer conductive trace 372 to at least one package-on-package pad (e.g., elements 328a and 328b). At least one second layer conductive trace 382 may be formed adjacent the first build-up dielectric layer 374 and a second build-up dielectric layer 384 may be formed adjacent the second layer conductive traces 382 and the first build-up dielectric layer 374. At least one trace-to-trace conductive via 386 may extend through the first build-up dielectric layer 374 to connect at least one first layer conductive trace 372 to at least one second layer conductive trace 382. At least one third layer conductive trace 392 may be formed on the second build-up dielectric layer 384 and at least one trace-to-trace conductive via 386 may extend through the second build-up dielectric layer 384 to connect at least one second layer conductive trace 382 to at least one third layer conductive trace 392. A solder resist material 394 may be patterned on the second build-up dielectric layer 384 and third layer conductive traces 392 having at least one opening 396 exposing at least a portion of the third layer conductive trace 392. It is understood that interconnection structures (not shown), such as solder balls, may be formed on the third layer conductive trace(s) 392 through the solder resist material opening(s) 396.

As further shown in FIG. 18, a second build-up layer 362' may be formed on the second encapsulation layer 352'. The second build-up layer 362' may comprise a plurality of dielectric layers with conductive traces formed adjacent each dielectric layer with conductive vias extending through each dielectric layer to connect the conductive traces on different layers. Referring to FIG. 18, the second build-up layer 362' may comprise at least one first layer conductive trace 372' with a first build-up dielectric layer 374' formed adjacent the first layer conductive trace 372' and the second encapsulation layer 352'. At least one trace-to-device conductive via 376' may extend through the first build-up dielectric layer 374' to connect at least one first layer conductive trace 372' to at least one microelectronic device contact land (e.g. elements 346a' and 346b'). At least one trace-to-pad conductive via 378' may extend through the first build-up dielectric layer 374' to connect at least one first layer conductive trace 372' to at least one package-on-package pad (e.g., elements 328a' and 328b'). At least one second layer conductive trace 382' may be formed adjacent the first build-up dielectric layer 374' and a second build-up dielectric layer 384' may be formed adjacent the second layer conductive traces 382' and the first build-up dielectric layer 374'. At least one trace-to-trace conductive via 386' may extend through the first build-up dielectric layer 374' to connect at least one first layer conductive trace 372' to at least one second layer conductive trace 382'. At least one third layer conductive trace 392' may be formed on the second build-up dielectric layer 384' and at least one trace-to-trace conductive via 386' may extend through the second build-up dielectric layer 384' to connect at least one second layer conductive trace 382' to at least one third layer conductive trace 392'. A solder resist material 394' may be patterned on the second build-up dielectric layer 384' and third layer conductive traces 392' having at least one opening 396' exposing at least a portion of the third layer conductive trace 392'. It is understood that interconnection structures (not shown), such as solder balls, may be formed on the third layer conductive trace(s) 392' through the solder resist material opening(s) 396'.

The conductive traces (e.g. elements 372, 372', 382, 382', 392, and 392') may any appropriate conductive material including but not limited to copper, aluminum, silver, gold, and alloys thereof, and may be made by any technique known in the art, including but not limited to photolithography and plating. The conductive vias (e.g. elements 376, 376', 378, 378', 386, and 386') may be any appropriate conductive material including but not limited to copper, aluminum, silver, gold, and alloys thereof, and may be made by any technique known in the art, including but not limited to laser drilling, ion drilling, photolithography, plating, and deposition.

It is understood that the additional dielectric layers, conductive vias, and conductive traces may be built up to form a desired number of build-up layers.

Figure 19:
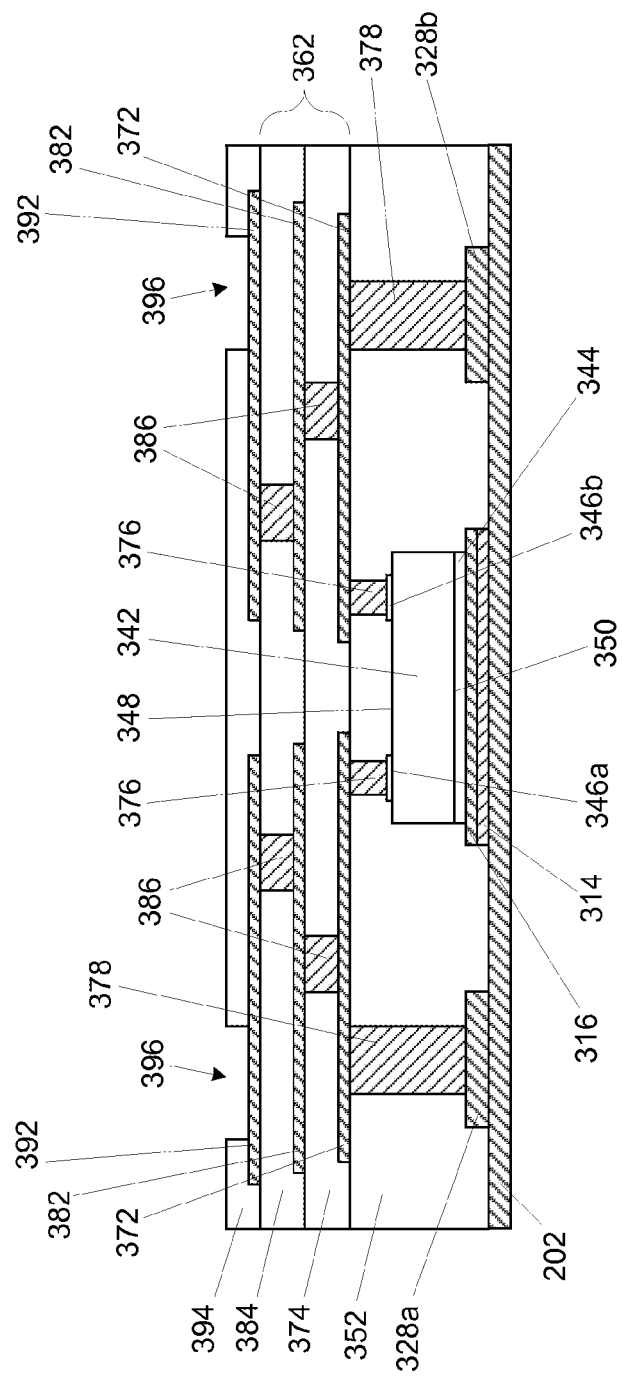
Figure 20:
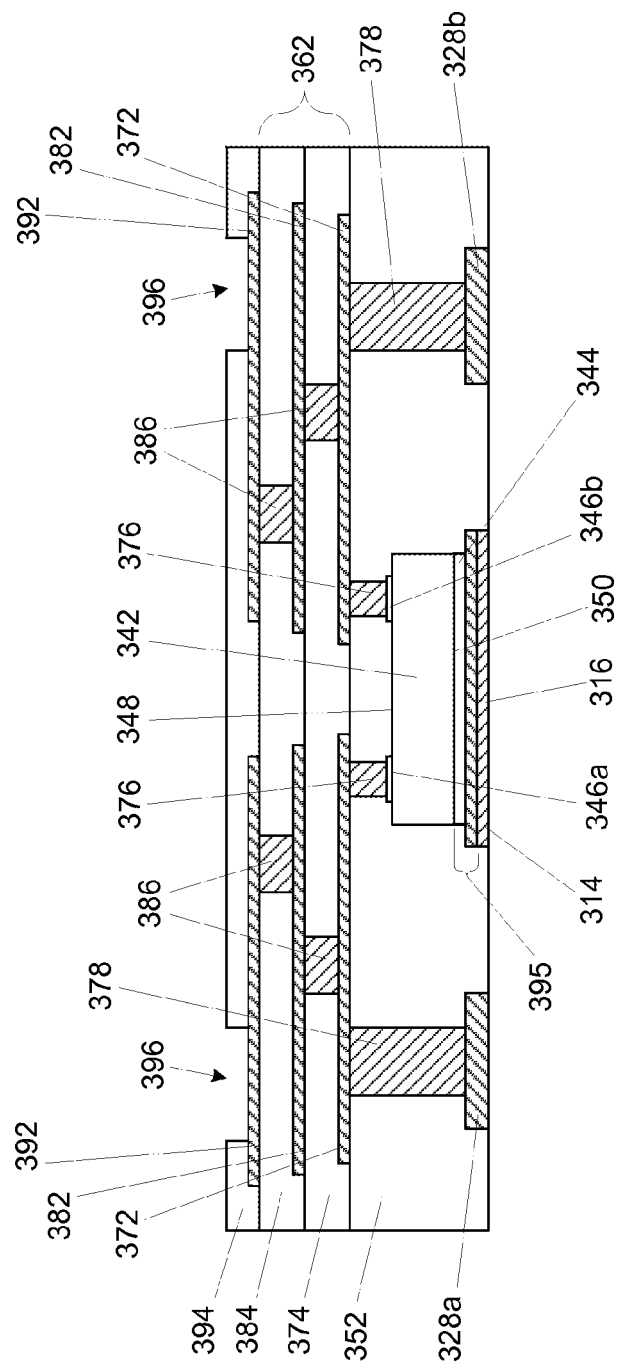

The structures thus formed on the carrier first surface 208 and on the carrier second surface 208' may be separated from one another with a depaneling process, as known in the art. FIG. 19 illustrates the structure formed on the carrier first surface 208 after depaneling. As shown in the FIG. 20, the copper layer 202 remaining from the carrier 200 after depaneling may be removed, such as by an etching process, to form a microelectronic device package 390. Thus, the process of FIGS. 14-20 forms a warpage control structure 395 comprising at least the high CTE material layer 344 and the high elastic modulus material layer 316.

Additional processing steps may be performed, including but not limited to singulation, stacking, and encapsulation, as will be understood to those skilled in the art.

It is understood that the subject matter of the present description is not necessarily limited to specific applications illustrated in FIGS. 1-20. The subject matter may be applied to other microelectronic device packaging applications, including other coreless and thin-core packages where warpage may be a concern. Furthermore, other warpage reduction techniques known in the art, including but not limited to glass cloth lamination, molding, and the like, can be combined with the subject matter of the present description. Moreover, the subject matter of the present description may be a part of a larger bumpless build-up package, it may include multiple stacked microelectronic dice, it may be formed at a wafer level, or any number of appropriate variations, as will be understood to those skilled in the art. Still further, the subject matter may also be used in any appropriate application outside of the microelectronic device fabrication field.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package comprising:
   forming a microelectronic device having an active surface, an opposing back surface, and at least one side;
   disposing a die backside film contacting the microelectronic device back surface;
   forming a warpage control structure contacting the die backside film, wherein the warpage control structure is formed by forming a high coefficient of thermal expansion material layer contacting the die backside film and forming a high elastic modulus material layer contacting the high coefficient of thermal expansion material layer;
   disposing an encapsulation material contacting at least a portion of the microelectronic device active surface, at least a portion of the at least one microelectronic device side, at least a portion of the die backside film, and at least a portion of the warpage control structure, wherein the encapsulation material includes a first surface proximate the microelectronic device active surface and a second surface opposing the encapsulation material first surface; and
   forming a package-on-package pad in or on the encapsulation material second surface.

2. The method of claim 1, wherein forming the high coefficient of thermal expansion material layer comprises forming a material layer having a coefficient of thermal expansion greater than about 25 ppm/° C.

3. The method of claim 1, wherein forming the high coefficient of thermal expansion material layer comprises forming a filled epoxy material layer.

4. The method of claim 1, wherein forming the high elastic modulus material layer comprises forming a material layer having a modulus greater than about 50 GPa.

5. The method of claim 1, wherein forming the high elastic modulus material layer comprises forming a copper layer.

6. The method of claim 1, wherein disposing the encapsulation material comprises disposing a filled epoxy material adjacent at least a portion of the microelectronic device active surface and at least a portion of at least one microelectronic device side.

7. The method of claim 1, further including forming a build-up layer on the first surface of the encapsulation material proximate the microelectronic device active surface.

8. A method of fabricating a microelectronic package comprising:
   providing a carrier;
   forming a microelectronic device attachment pad on the carrier, wherein the microelectronic device attachment pad includes a protective layer abutting the carrier and a high elastic modulus material layer abutting the protective layer;
   attaching a microelectronic device having an active surface, an opposing back surface, and at least one side, to the microelectronic device attachment pad, wherein attaching the microelectronic device includes disposing a high coefficient of thermal expansion material layer between the microelectronic device back surface and the microelectronic device attachment pad, wherein the high coefficient of thermal expansion material layer is disposed across and contacts the entire microelectronic device back surface;
   disposing an encapsulation material contacting at least a portion of the microelectronic device active surface, at least one a portion of at least one microelectronic device side, at least a portion of the high elastic modulus material layer, and at least a portion of the high elastic modulus material layer, wherein the encapsulation material includes a first surface proximate the microelectronic device active surface and a second surface opposing the encapsulation material first surface;
   forming a package-on-package pad in or on the encapsulation material second surface; and
   removing the carrier.

9. The method of claim 8, wherein disposing the high coefficient of thermal expansion material layer between the microelectronic device back surface and the microelectronic device attachment pad comprises disposing a material layer having a coefficient of thermal expansion greater than about 25 ppm/° C.

10. The method of claim 8, wherein disposing the high coefficient of thermal expansion material layer between the microelectronic device back surface and the microelectronic device attachment pad comprises disposing a filled epoxy material layer.

11. The method of claim 8, wherein the microelectronic device attachment pad includes a high elastic modulus material layer having a modulus greater than about 50 GPa.

12. The method of claim 8, wherein the microelectronic device attachment pad includes a copper high elastic modulus material layer.

13. The method of claim 8, wherein disposing the encapsulation material comprises disposing a filled epoxy material contacting at least a portion of the microelectronic device active surface and at least a portion of at least one microelectronic device side.

14. The method of claim 8, further including forming a build-up layer formed on the first surface of the encapsulation material proximate the microelectronic device active surface.

15. The method of claim 8, wherein forming the microelectronic device attachment pad on the carrier comprises forming the protective layer adjacent the carrier and forming the high elastic modulus material layer adjacent the protective layer.

* * * * *